(12) United States Patent
Choi et al.

(10) Patent No.: US 8,008,121 B2
(45) Date of Patent: Aug. 30, 2011

(54) SEMICONDUCTOR PACKAGE AND METHOD OF MOUNTING SEMICONDUCTOR DIE TO OPPOSITE SIDES OF TSV SUBSTRATE

(75) Inventors: DaeSik Choi, Seoul (KR); JongHo Kim, Gyeonggi (KR); HyungMin Lee, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 27 days.

(21) Appl. No.: 12/612,365

(22) Filed: Nov. 4, 2009

(65) Prior Publication Data

US 2011/0101512 A1    May 5, 2011

(51) Int. Cl.
*H01L 21/00* (2006.01)
*H01L 23/02* (2006.01)

(52) U.S. Cl. ............ 438/107; 438/51; 438/55; 438/108; 438/109; 438/110; 438/112; 438/127; 257/127

(58) Field of Classification Search ............ 438/51, 438/55, 107, 108, 109, 110, 112, 127; 257/686
See application file for complete search history.

(56) References Cited

U.S. PATENT DOCUMENTS

| | | | |
|---|---|---|---|
| 5,815,372 A * | 9/1998 | Gallas ........................... | 361/760 |
| 5,977,640 A | 11/1999 | Bertin et al. | |
| 6,137,164 A | 10/2000 | Yew et al. | |
| 6,753,205 B2 * | 6/2004 | Halahan ........................ | 438/107 |
| 6,774,473 B1 | 8/2004 | Shen | |
| 7,170,158 B2 | 1/2007 | Choi et al. | |
| 2008/0128882 A1 | 6/2008 | Baek et al. | |
| 2009/0166837 A1 * | 7/2009 | Webster et al. ............... | 257/686 |

* cited by examiner

*Primary Examiner* — Long K Tran
(74) *Attorney, Agent, or Firm* — Robert D. Atkins; Patent Law Group

(57) ABSTRACT

A semiconductor package has a first conductive via formed through a substrate. The substrate with first conductive via is mounted to a first carrier. A first semiconductor die is mounted to a first surface of the substrate. A first encapsulant is deposited over the first die and first carrier. The first carrier is removed. The first die and substrate with the first encapsulant is mounted to a second carrier. A second semiconductor die is mounted to a second surface of the substrate opposite the first surface of the substrate. A second encapsulant is deposited over the second die. The second carrier is removed. A bump is formed over the second surface of the substrate. A conductive layer can be mounted over the first die. A second conductive via can be formed through the first encapsulant and electrically connected to the first conductive via. The semiconductor packages are stackable.

13 Claims, 11 Drawing Sheets

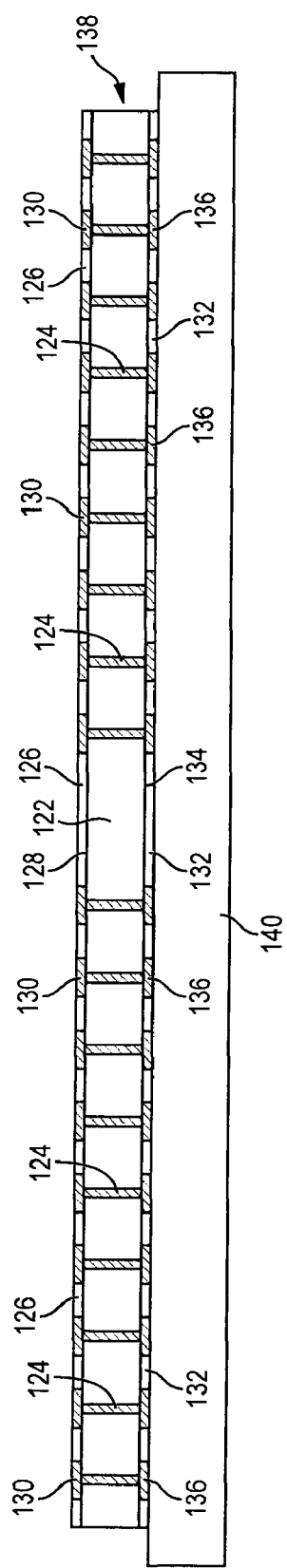
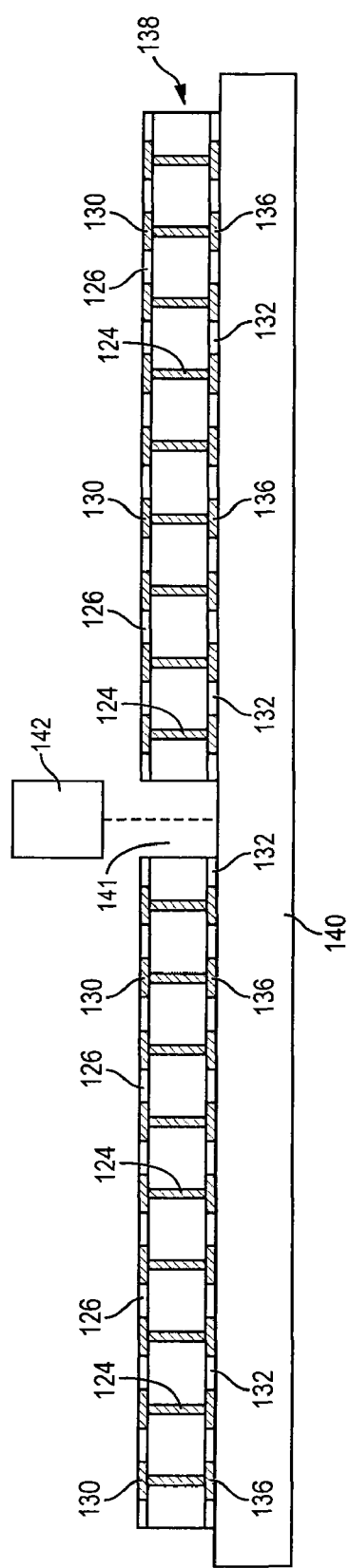
FIG. 3d
FIG. 3e

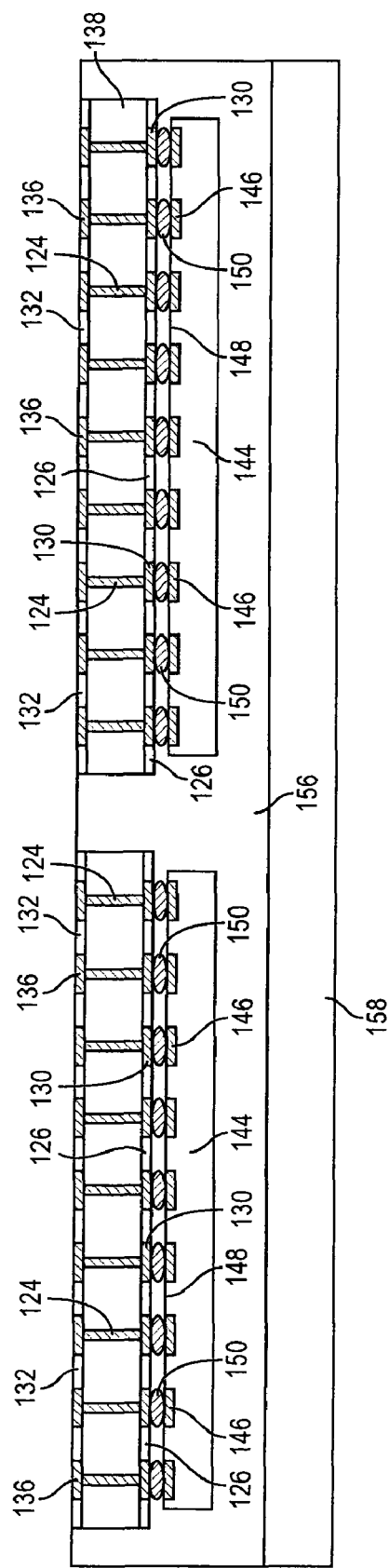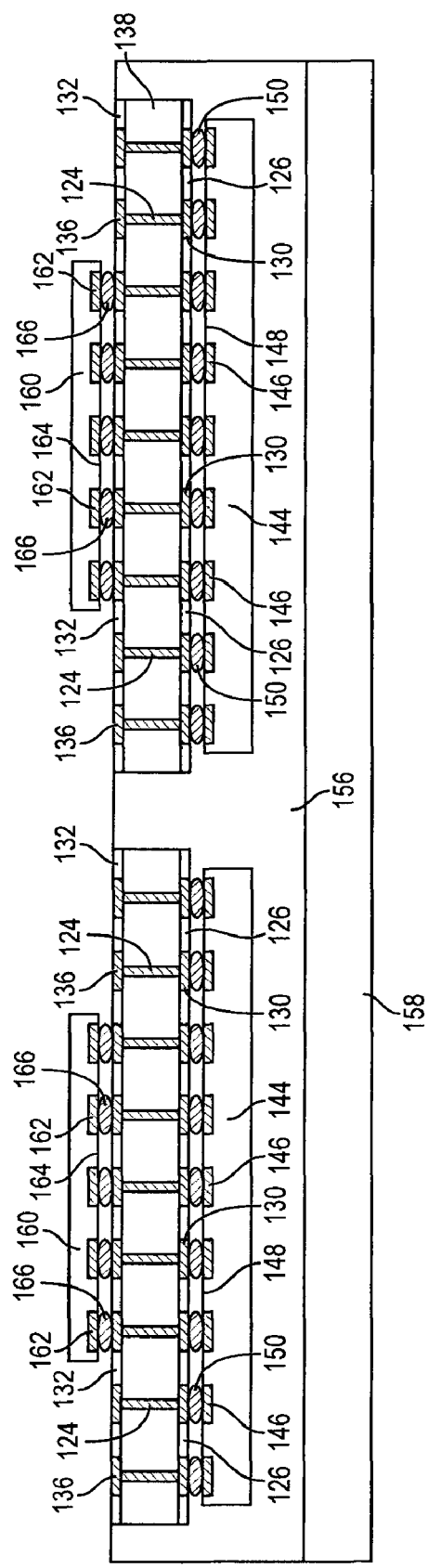
FIG. 3h
FIG. 3i

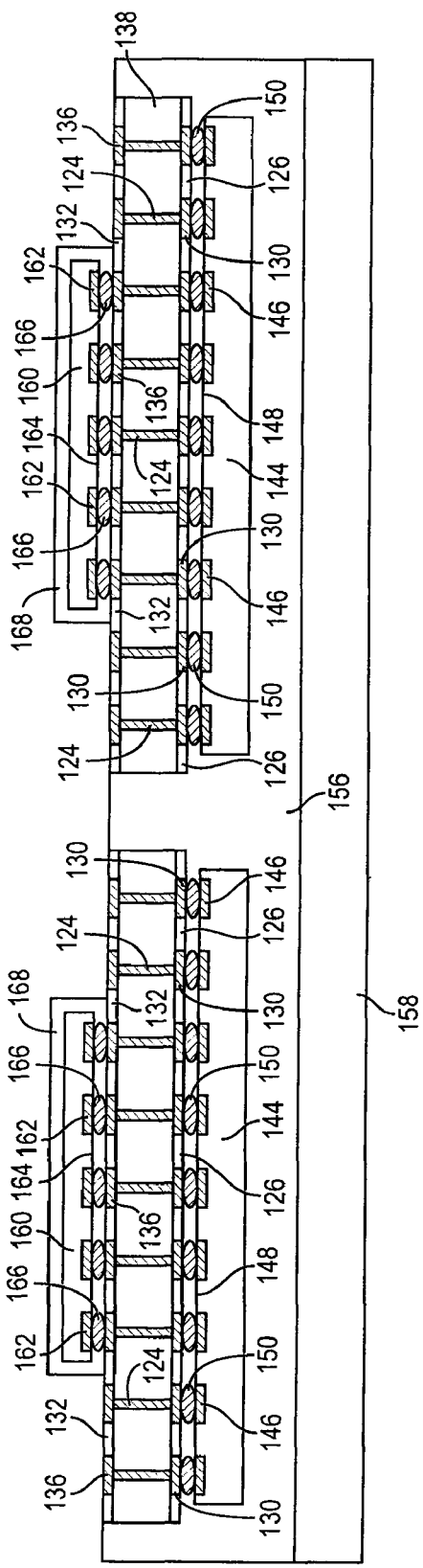
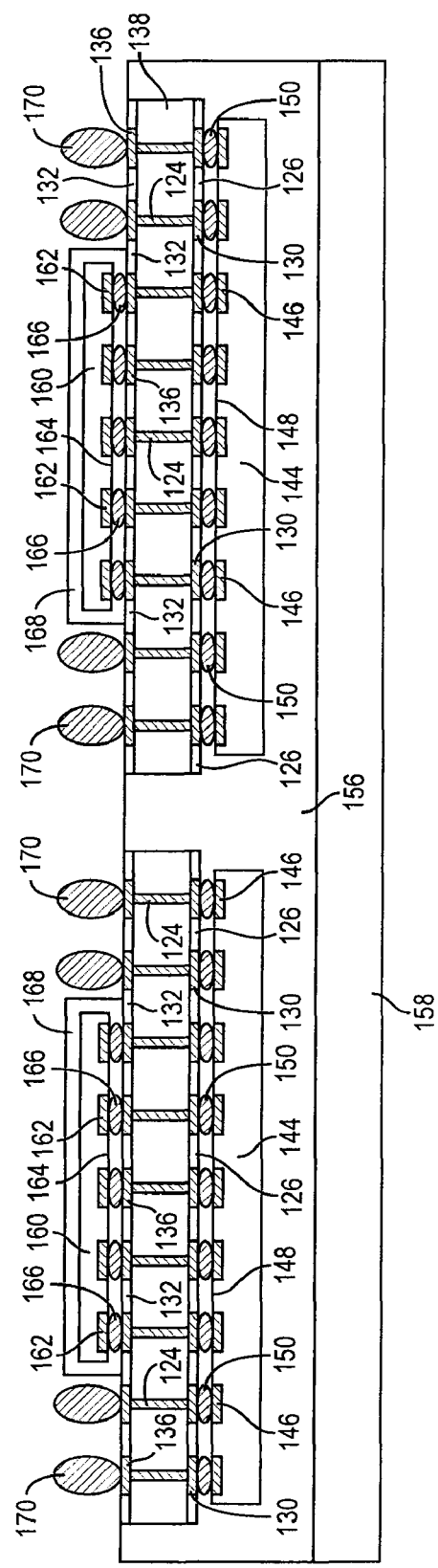
FIG. 3j
FIG. 3k

SEMICONDUCTOR PACKAGE AND METHOD OF MOUNTING SEMICONDUCTOR DIE TO OPPOSITE SIDES OF TSV SUBSTRATE

FIELD OF THE INVENTION

The present invention relates in general to semiconductor devices and, more particularly, to a semiconductor package and method of forming a TSV substrate and mounting semiconductor die to opposite sides of the TSV substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Many semiconductor packages use stacked semiconductor die for vertical integration. The stacked semiconductor die are electrically connected with bond wires, bumps, or conductive vias formed through the encapsulant. The vertical interconnect between semiconductor die consumes space and increases the overall height of the package, as well as imposing higher manufacturing costs.

SUMMARY OF THE INVENTION

A need exists to stack semiconductor die with minimal space for vertical electrical interconnect. Accordingly, in one embodiment, the present invention is a method of making a semiconductor package comprising the steps of providing a wafer level substrate, forming a plurality of vias through the wafer level substrate, depositing conductive material in the vias to form first conductive vias through the wafer level substrate, providing a first carrier, mounting the wafer level substrate with first conductive vias to the first carrier, mounting a first semiconductor die to a first surface of the wafer level substrate, depositing a first encapsulant over the first semiconductor die and first carrier, removing the first carrier, providing a second carrier, mounting the first semiconductor die and wafer level substrate with the first encapsulant to the second carrier, mounting a second semiconductor die to a second surface of the wafer level substrate opposite the first surface of the wafer level substrate, depositing a second encapsulant over the second semiconductor die, and removing the second carrier.

In another embodiment, the present invention is a method of making a semiconductor package comprising the steps of providing a substrate, forming a first conductive via through the substrate, mounting the substrate with first conductive via to a first carrier, mounting a first semiconductor die to a first surface of the substrate, depositing a first encapsulant over the first semiconductor die and first carrier, removing the first carrier, mounting the first semiconductor die and substrate with the first encapsulant to a second carrier, mounting a second semiconductor die to a second surface of the substrate opposite the first surface of the substrate, depositing a second encapsulant over the second semiconductor die, and removing the second carrier.

In another embodiment, the present invention is a method of making a semiconductor package comprising the steps of providing a substrate having a first conductive via through the substrate, mounting a first semiconductor die to a first surface of the substrate, depositing a first encapsulant over the first semiconductor die, mounting a second semiconductor die to a second surface of the substrate opposite the first surface of the substrate, and depositing a second encapsulant over the second semiconductor die.

In another embodiment, the present invention is a semiconductor package comprising a substrate having a first conductive via through the substrate. A first semiconductor die is mounted to a first surface of the substrate. A first encapsulant is deposited over the first semiconductor die. A second semiconductor die is mounted to a second surface of the substrate opposite the first surface of the substrate. A second encapsulant is deposited over the second semiconductor die.

BRIEF DESCRIPTION OF THE DRAWINGS

FIGS. 3a-3l illustrate a process of forming a TSV substrate and mounting semiconductor die to opposite sides of the TSV substrate;

DETAILED DESCRIPTION OF THE DRAWINGS

Figure 1:
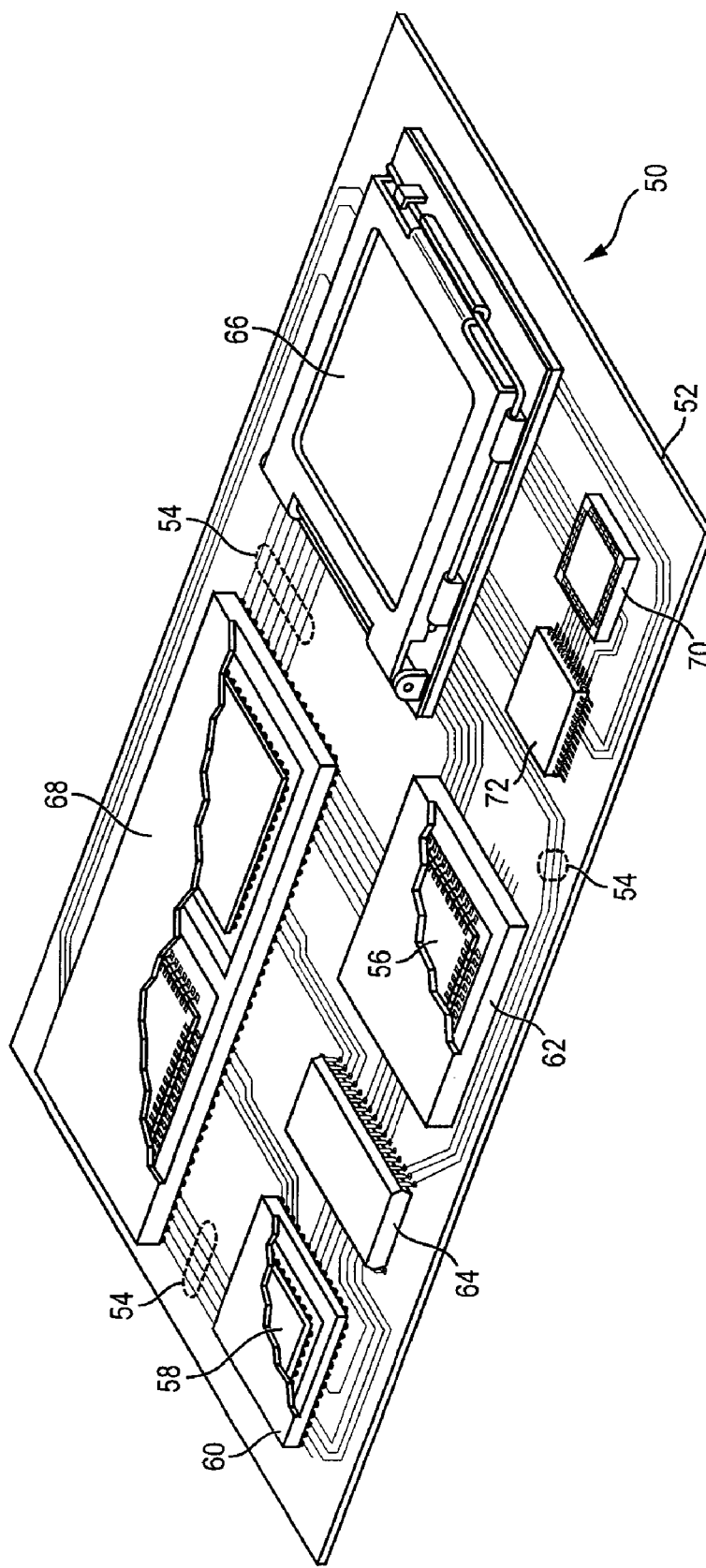
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
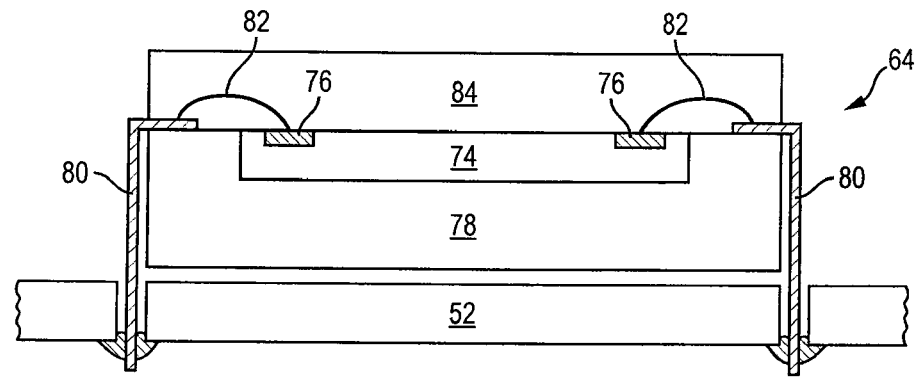
FIGS. 2a-2c illustrate further detail of the representative semiconductor packages mounted to the PCB.
Figure 2B:
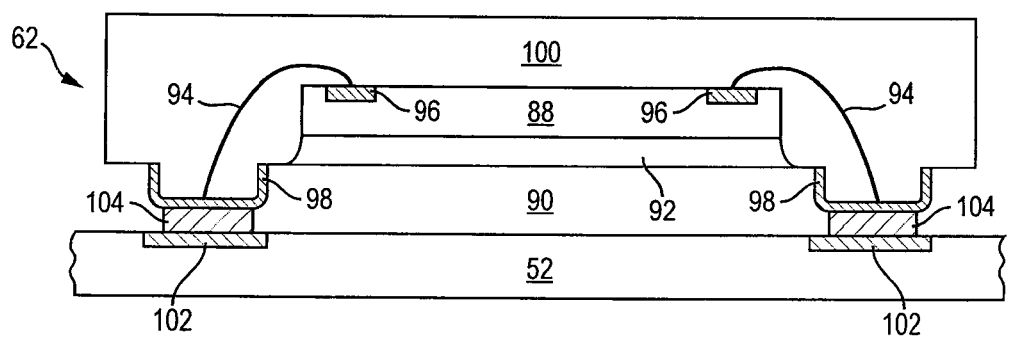
Figure 2C:
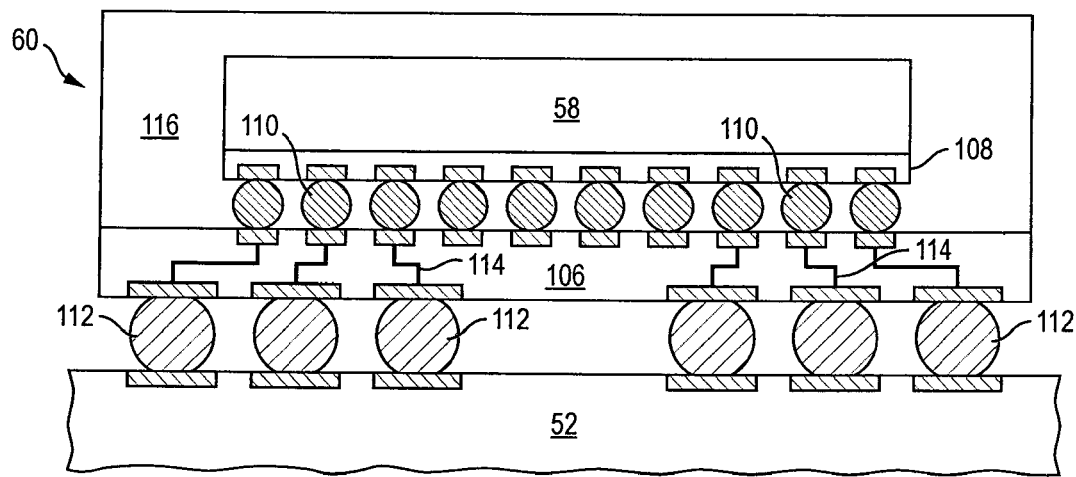

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
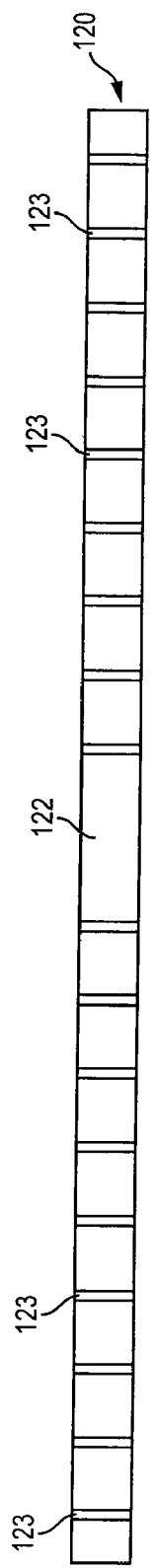

FIGS. 3a-3l illustrate, in relation to FIGS. 1 and 2a-2c, a process of forming a TSV substrate and mounting semiconductor die to opposite sides of the TSV substrate. In FIG. 3a, a semiconductor wafer 120 contains a base substrate material 122 such as silicon, germanium, gallium arsenide, indium phosphide, or silicon carbide, for structural support. A plurality of vias 123 is formed through substrate 122 using laser drilling or deep reactive ion etching (DRIE).

Figure 3B:
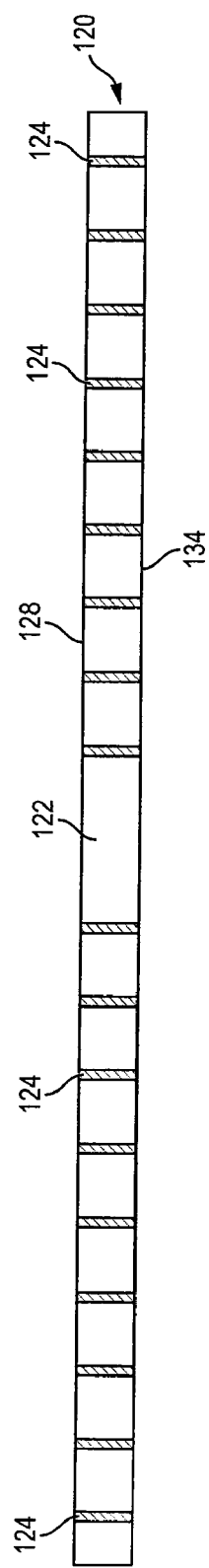

In FIG. 3b, an electrically conductive material is deposited into vias 123 using electrolytic plating or electroless plating to form conductive through silicon vias (TSV) 124. Conductive TSVs 124 can be one or more layers of Al, Cu, Sn, Ni, Au, Ag, or other suitable electrically conductive material.

Figure 3C:
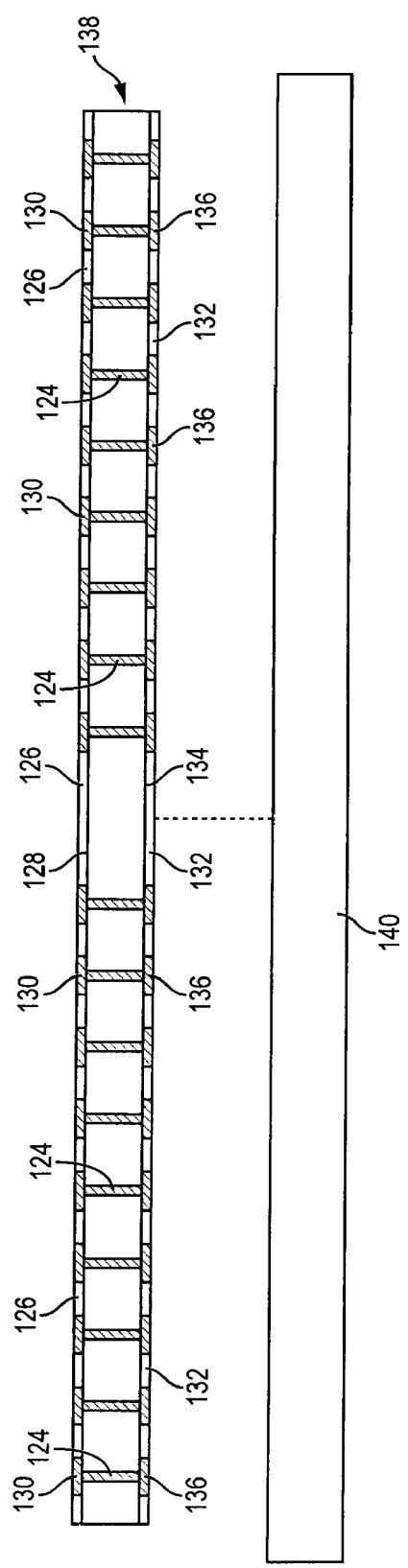

In FIG. 3c, an insulating or passivation layer 126 is formed over surface 128 of substrate 122 and TSV 124 using PVD, CVD, printing, spin coating, spray coating, sintering or thermal oxidation. The insulating layer 126 can be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 126 is removed by an etching process to expose TSV 124.

An electrically conductive layer 130 is formed over surface 128 of substrate 122 and TSVs 124 in the removed portions of insulating layer 126 using a patterning and metal deposition process such as PVD, CVD, sputtering, electrolytic plating, and electroless plating. Conductive layer 130 can be one or more layers of Al, Cu, Sn, Ni, Au, Ag, or other suitable electrically conductive material. Conductive layer 130 is electrically connected to TSVs 124. Other portions of conductive layer 130 can be electrically common or electrically isolated depending on the design and function of the semiconductor device.

An insulating or passivation layer 132 is formed over TSV 124 and surface 134 of substrate 122, opposite surface 128 of substrate 122, using PVD, CVD, printing, spin coating, spray coating, sintering or thermal oxidation. The insulating layer 132 can be one or more layers of SiO2, Si3N4, SiON, Ta2O5, Al2O3, or other material having similar insulating and structural properties. A portion of insulating layer 132 is removed by an etching process to expose TSV 124.

An electrically conductive layer 136 is formed over surface 134 of substrate 122 in the removed portions of insulating layer 132 using a patterning and metal deposition process such as PVD, CVD, sputtering, electrolytic plating, and electroless plating. Conductive layer 136 can be one or more layers of Al, Cu, Sn, Ni, Au, Ag, or other suitable electrically conductive material. Conductive layer 136 is electrically connected to TSVs 124. Other portions of conductive layer 136 can be electrically common or electrically isolated depending on the design and function of the semiconductor device.

A substrate or carrier 140 contains temporary or sacrificial base material such as silicon, polymer, polymer composite, metal, ceramic, glass, glass epoxy, beryllium oxide, or other suitable low-cost, rigid material for structural support. The wafer level TSV substrate or interposer 138 is mounted to carrier 140, as shown in FIGS. 3c and 3d.

In FIG. 3e, a gap 141 is cut through substrate 122 of semiconductor wafer 120 with saw blade or laser cutting tool 142 down to carrier 140. Saw blade 142 does not sever or weaken carrier 140, i.e., carrier 140 retains its support property across the remaining sections of substrate 122.

Figure 3F:
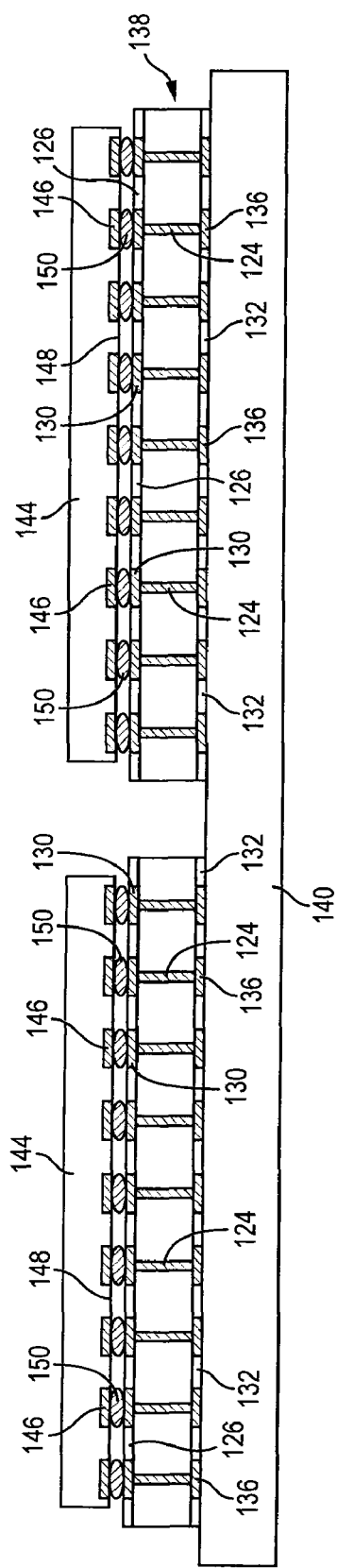

In FIG. 3f, semiconductor die or component 144 are mounted to substrate 122. Each semiconductor die 144 has contact pads 146 formed on active surface 148 oriented toward surface 128 of substrate 122. Active surface 148 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 148 to implement analog circuits or digital circuits, such as digital signal processor (DSP), ASIC, memory, or other signal processing circuit. Semiconductor die 144 may also contain IPD, such as inductors, capacitors, and resistors, for RF signal processing. A plurality of bumps 150 is formed over conductive layer 130 or contact pads 146 and reflowed to electrically connect contact pads 146 to conductive layer 130. In one embodiment, semiconductor die 144 is implemented as a flipchip style device.

Figure 3G:
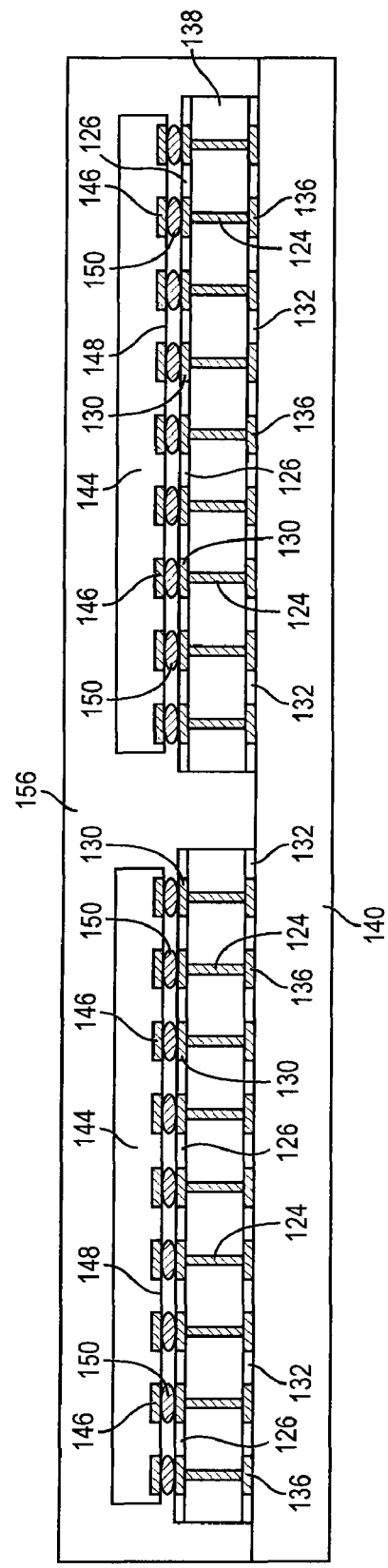

In FIG. 3g, an encapsulant or molding compound 156 is deposited over semiconductor die 144, substrate 122, and carrier 140 using a paste printing, compressive molding, transfer molding, liquid encapsulant molding, vacuum lamination, spin coating, or other suitable applicator. Encapsulant 156 can be polymer composite material, such as epoxy resin with filler, epoxy acrylate with filler, or polymer with proper filler. Encapsulant 156 is non-conductive and environmentally protects the semiconductor device from external elements and contaminants.

In FIG. 3h, a substrate or carrier 158 contains temporary or sacrificial base material such as silicon, polymer, polymer composite, metal, ceramic, glass, glass epoxy, beryllium oxide, or other suitable low-cost, rigid material for structural support. The structure described in FIGS. 3a-3g is inverted and mounted with encapsulant 156 to carrier 158. The temporary carrier 140 is removed by chemical etching, mechanical peel-off, CMP, mechanical grinding, thermal bake, laser scanning, or wet stripping.

In FIG. 3i, semiconductor die or component 160 are mounted to TSV substrate 138. Each semiconductor die 160 has contact pads 162 formed on active surface 164 oriented toward TSV surface 138. Active surface 164 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 164 to implement analog circuits or digital circuits, such as DSP, ASIC, memory, or other signal processing circuit. Semiconductor die 160 may also contain IPD, such as inductors, capacitors, and resistors, for RF signal processing. A plurality of bumps 166 is formed over conductive layer 136 or contact pads 162 and ref lowed to electrically connect contact pads 162 to conductive layer 136. In one embodiment, semiconductor die 160 is implemented as a flipchip style device.

In FIG. 3j, an encapsulant or molding compound 168 is deposited over semiconductor die 160 using a paste printing, compressive molding, transfer molding, liquid encapsulant molding, vacuum lamination, spin coating, or other suitable applicator. Encapsulant 168 can be polymer composite material, such as epoxy resin with filler, epoxy acrylate with filler, or polymer with proper filler. Encapsulant 168 is non-conductive and environmentally protects the semiconductor device from external elements and contaminants.

In FIG. 3k, an electrically conductive bump material is deposited over conductive layer 136 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 136 using a suitable attachment or bonding process. In one embodiment, the bump material is reflowed by heating the material above its melting point to form spherical balls or bumps 170. In some applications, bumps 170 are reflowed a second time to improve electrical contact to conductive layer 136. The bumps can also be compression bonded to conductive layer 136. Bumps 170 represent one type of interconnect structure that can be formed over conductive layer 136. The interconnect structure can also use stud bumps, micro bumps, conductive pillars, or other electrical interconnect.

Figure 3L:
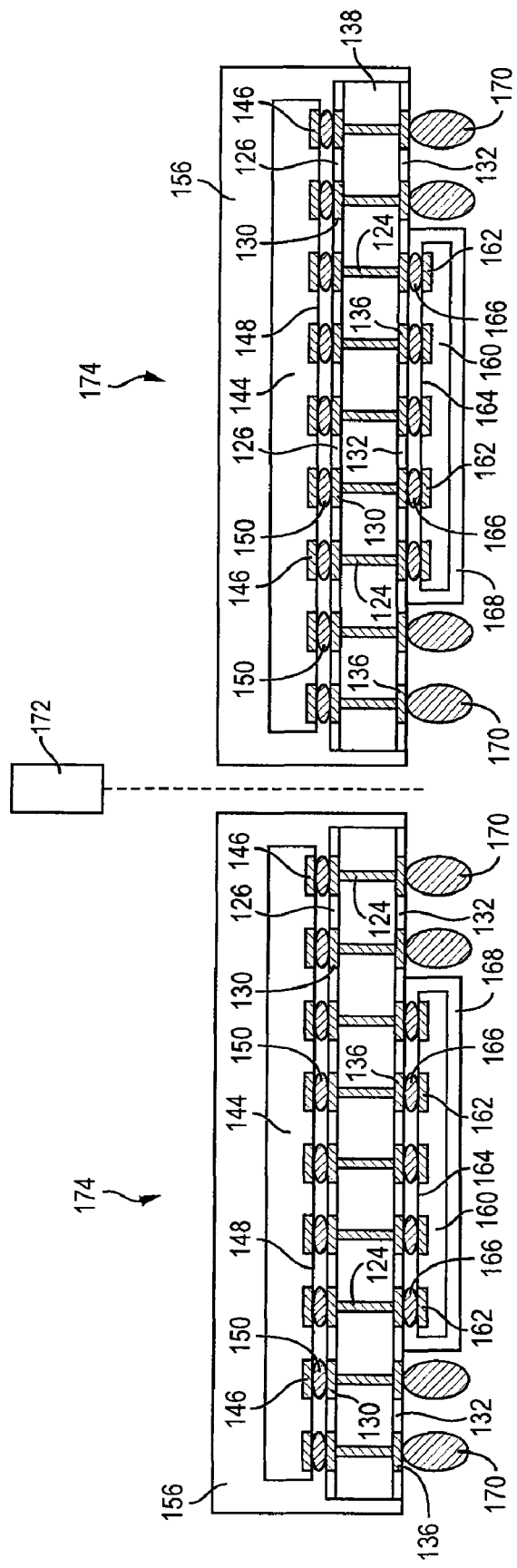

In FIG. 3l, the temporary carrier 158 is removed by chemical etching, mechanical peel-off, CMP, mechanical grinding, thermal bake, laser scanning, or wet stripping. The structure is singulated through encapsulant 156 with saw blade or laser cutting tool 172 into separate wafer level stacked semiconductor packages 174.

Semiconductor die 144 and 160 are mounted to opposite sides of wafer level TSV substrate or interposer 138 and electrically connected with TSV 124. The thickness of semiconductor package 174 is reduced by stacking semiconductor die 144 and 160 on both sides of TSV substrate 138. The coefficient of thermal expansion (CTE) can be matched as TSV substrate is made of similar material, e.g., silicon, as semiconductor die 144 and 160.

Figure 4:
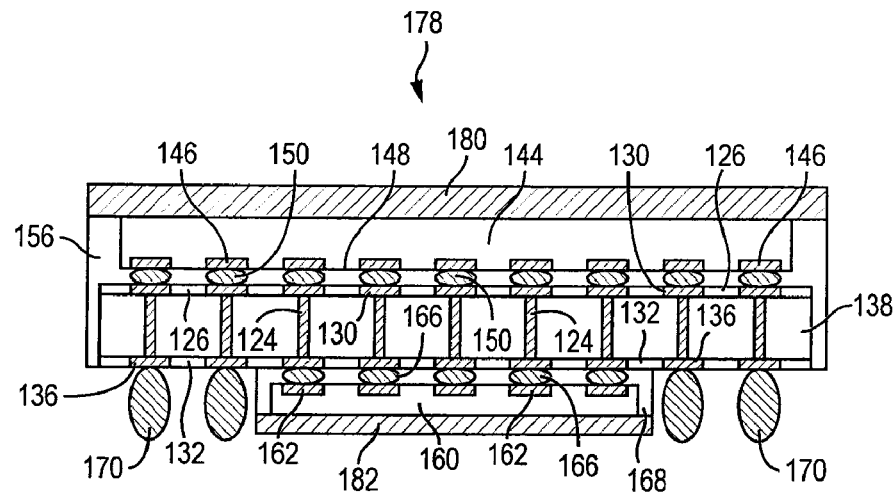
FIG. 4 illustrates metal layers mounted over the semiconductor die.

FIG. 4 shows an embodiment of semiconductor package 178, similar to the structure described in FIGS. 3a-3l, with metal layer 180 mounted to semiconductor die 144, and metal layer 182 mounted to semiconductor die 160. In one embodiment, metal layers 180 and 182 operate as a heat sink to dissipate thermal energy from semiconductor die 144 and 160. Metal layers 180 and 182 can be Al, Cu, or another material with high thermal conductivity to provide heat dissipation for semiconductor die 144 and 160. An optional thermal interface material, such as aluminum oxide, zinc oxide, boron nitride, or pulverized silver, between the heat sink and semiconductor die aids in the distribution and dissipation of heat generated by semiconductor die 144 and 160.

In another embodiment, metal layers 180 and 182 are electromagnetic interference (EMI) and radio frequency interference (RFI) shielding layers. In this case, shielding layers 180 and 182 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layers 180 and 182 can also be a non-metal material such as carbon-black or aluminum flake to reduce the effects of EMI and RFI. Shielding layers 180 and 182 are grounded to divert the EMI and RFI signals.

Figure 5:
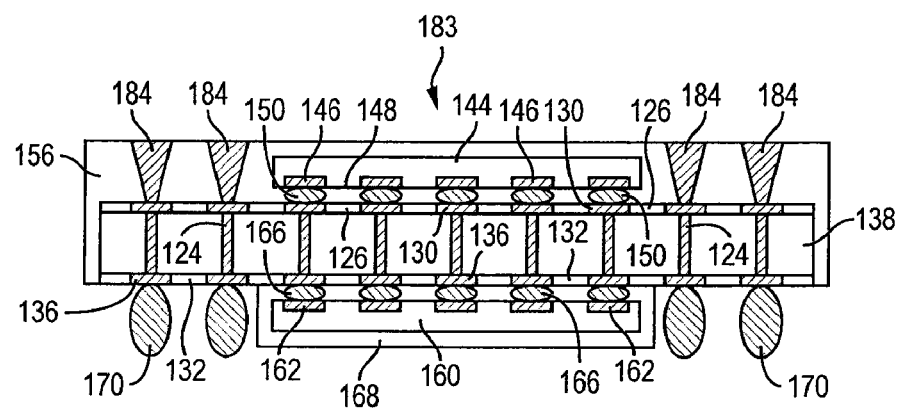
FIG. 5 illustrates conductive vias formed in the encapsulant over the TSV substrate.

FIG. 5 shows an embodiment of semiconductor package 183, similar to the structure described in FIGS. 3a-3l, with a narrower semiconductor die 144 or wider TSV substrate 138 to make room for conductive vias 184. A plurality of vias is formed through encapsulant 156 using laser drilling or etching process, such as DRIE. The vias are filled with Al, Cu, Sn, Ni, Au, Ag, titanium (Ti), W, poly-silicon, or other suitable electrically conductive material using electrolytic plating or electroless plating to form conductive vias 184.

Figure 6:
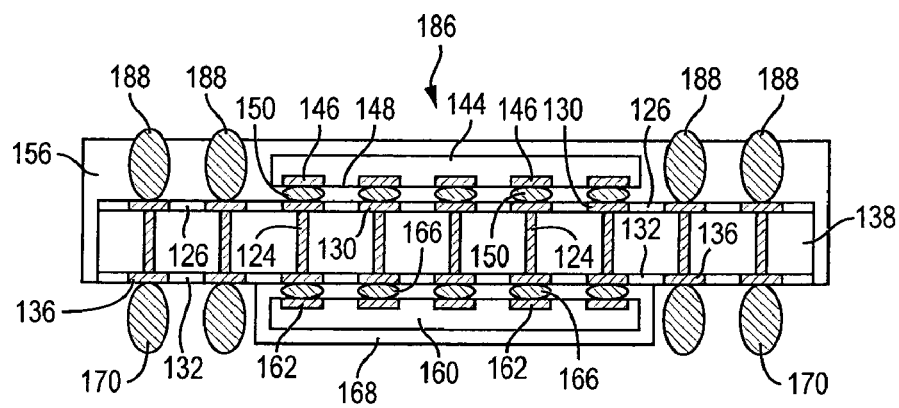
FIG. 6 illustrates bumps formed in the encapsulant over the TSV substrate.

FIG. 6 shows an embodiment of semiconductor package 186, similar to the structure described in FIGS. 3a-3l, with a narrower semiconductor die 144 or wider TSV substrate 138 to make room for bumps 188. Bumps 188 are formed over conductive layer 130, similar to FIG. 3k, prior to depositing encapsulant 156. Bumps 188 are electrically connected to conductive layer 130.

Figure 7:
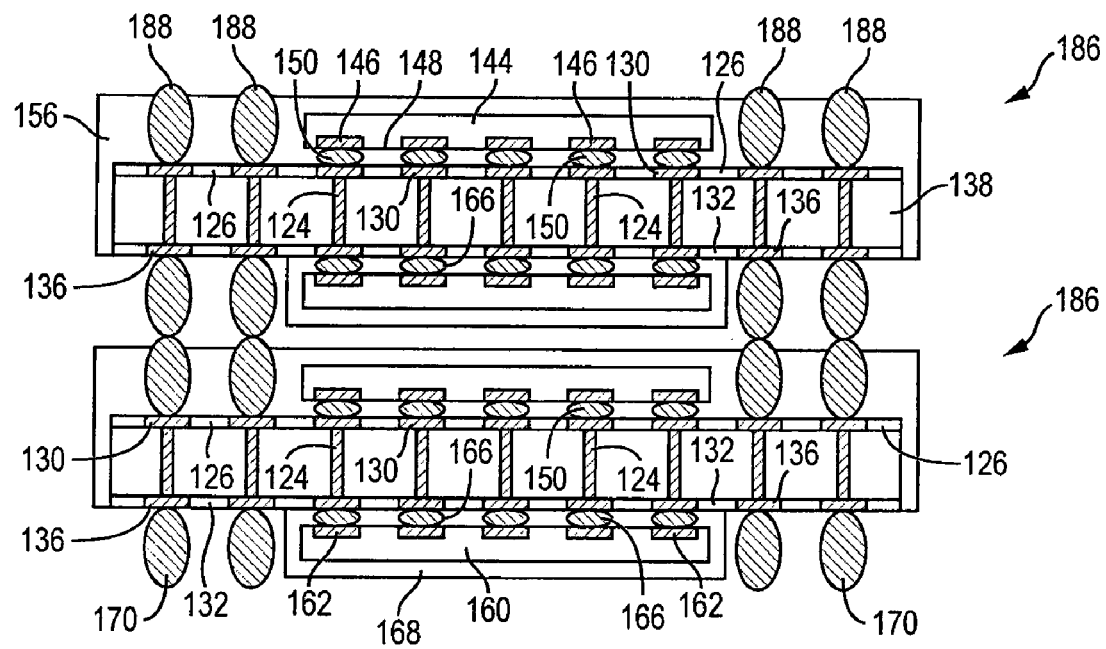
FIG. 7 illustrates stacked semiconductor packages each with semiconductor die mounted to opposite sides of TSV substrate.

FIG. 7 shows a package-on-package (PoP) with two stacked semiconductor packages 186 electrically connected through bumps 170 and 188.

Figure 8:
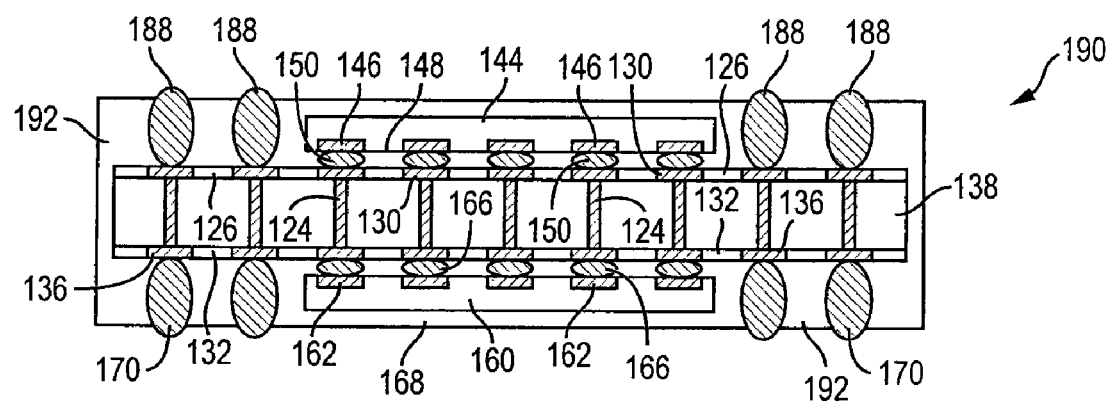
FIG. 8 illustrates the bumps encapsulated for stacking the semiconductor packages.

FIG. 8 shows an embodiment of semiconductor package 190, similar to the structure described in FIG. 6, with encapsulant 192 formed over bumps 170. Semiconductor package 190 is suitable for stacking a plurality of similar semiconductor packages.

Figure 9:
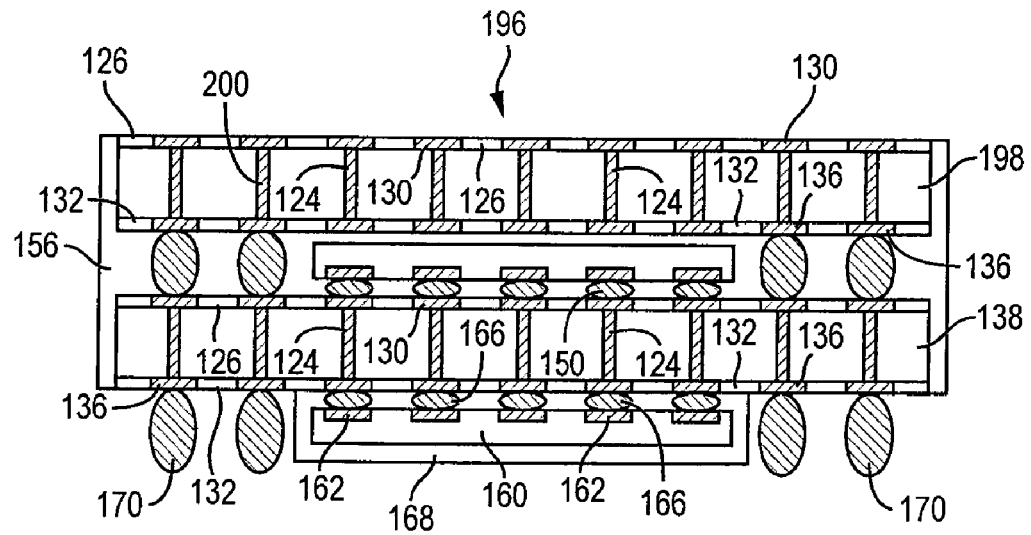
FIG. 9 illustrates a second TSV substrate mounted to the semiconductor package with semiconductor die mounted to opposite sides of the first TSV substrate.

FIG. 9 shows an embodiment of semiconductor package 196, similar to the structure described in FIG. 6, with TSV substrate 198 (similar to TSV substrate 138) mounted to semiconductor die 144. TSV 200 of TSV substrate 198 are electrically connected to bumps 188.

Figure 10:
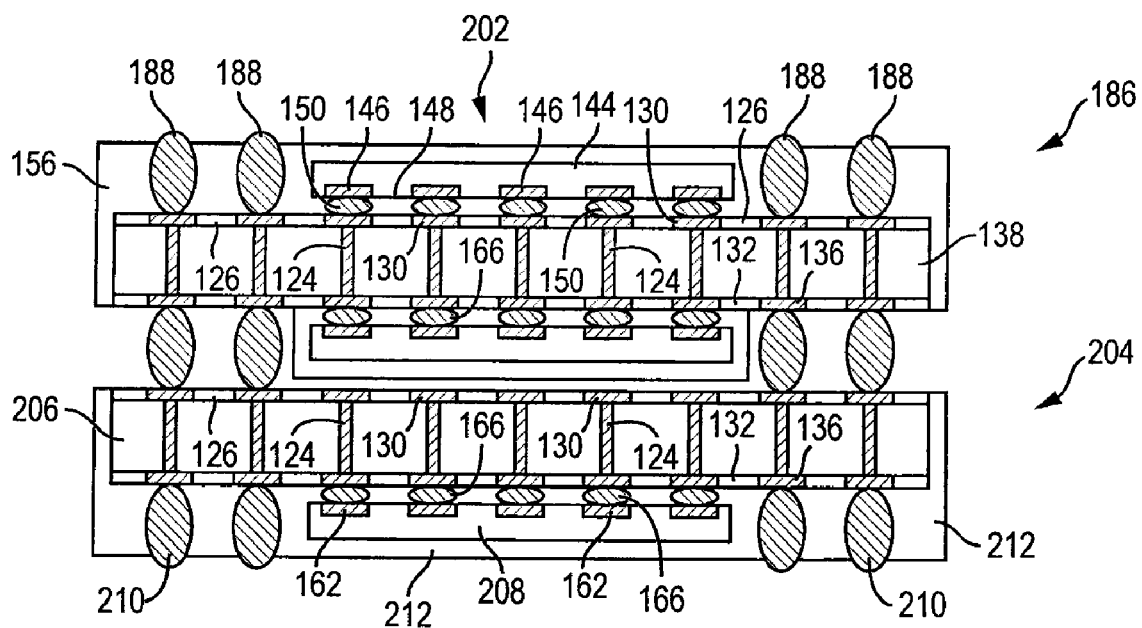
FIG. 10 illustrates stacked semiconductor packages each with semiconductor die mounted to the TSV substrate.

FIG. 10 shows a PoP embodiment of semiconductor package 202 with semiconductor package 186 mounted to semiconductor package 204. Semiconductor package 204 includes TSV substrate 206 and semiconductor die 208 made using similar process steps as described in FIGS. 3a-3g. Bumps 210 are formed over TSV substrate 206, similar to FIG. 3k. Encapsulant 212 is deposited over semiconductor die 208 and bumps 210. Semiconductor package 204 is electrically connected to semiconductor package 186 through bumps 170.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor package, comprising:

providing a wafer level substrate;
forming a plurality of vias through the wafer level substrate;
depositing conductive material in the vias to form first conductive vias through the wafer level substrate;
providing a first carrier;
mounting the wafer level substrate with first conductive vias to the first carrier;
mounting a first semiconductor die to a first surface of the wafer level substrate;
depositing a first encapsulant over the first semiconductor die and first carrier;
removing the first carrier;
providing a second carrier;
mounting the first semiconductor die and wafer level substrate with the first encapsulant to the second carrier;
mounting a second semiconductor die to a second surface of the wafer level substrate opposite the first surface of the wafer level substrate;
depositing a second encapsulant over the second semiconductor die; and
removing the second carrier.

2. The method of claim 1, further including forming a plurality of bumps over the second surface of the wafer level substrate.

3. The method of claim 1, further including mounting a conductive layer over the first semiconductor die.

4. The method of claim 1, further including forming a plurality of second conductive vias through the first encapsulant, the second conductive vias being electrically connected to the first conductive vias.

5. The method of claim 1, further including forming a plurality of bumps over the first conductive vias prior to depositing the first encapsulant.

6. The method of claim 1, further including stacking a plurality of semiconductor packages each containing the first and second semiconductor die mounted to the first and second surfaces of the wafer level substrate.

7. The method of claim 1, further including stacking a plurality of semiconductor packages each containing the first semiconductor die mounted to the first surface of the wafer level substrate.

8. A method of making a semiconductor package, comprising:

providing a substrate;
forming a first conductive via through the substrate;
mounting the substrate with first conductive via to a first carrier;
mounting a first semiconductor die to a first surface of the substrate;
depositing a first encapsulant over the first semiconductor die and first carrier;
removing the first carrier;
mounting the first semiconductor die and substrate with the first encapsulant to a second carrier;
mounting a second semiconductor die to a second surface of the substrate opposite the first surface of the substrate;
depositing a second encapsulant over the second semiconductor die; and
removing the second carrier.

9. The method of claim 8, further including forming a bump over the second surface of the substrate.

10. The method of claim 8, further including mounting a conductive layer over the first semiconductor die.

11. The method of claim 8, further including forming a second conductive via through the first encapsulant, the second conductive via being electrically connected to the first conductive via.

12. The method of claim 8, further including forming a bump over the first conductive via prior to depositing the first encapsulant.

13. The method of claim 8, further including stacking a plurality of semiconductor packages each containing the first and second semiconductor die mounted to the first and second surfaces of the substrate.

* * * * *